US009715480B1

(12) United States Patent
Tally et al.

(10) Patent No.: US 9,715,480 B1
(45) Date of Patent: Jul. 25, 2017

(54) METHOD FOR ANALYTICAL RECONSTRUCTION OF DIGITAL SIGNALS VIA STITCHED POLYNOMIAL FITTING

(71) Applicants: Charles H. Tally, San Diego, CA (US); Paul David Swanson, Santee, CA (US); Richard L. Waters, San Diego, CA (US)

(72) Inventors: Charles H. Tally, San Diego, CA (US); Paul David Swanson, Santee, CA (US); Richard L. Waters, San Diego, CA (US)

(73) Assignee: United States of America as represented by Secretary of the Navy, Washington, DC (US)

( * ) Notice: Subject to any disclaimer, the term of this patent is extended or adjusted under 35 U.S.C. 154(b) by 898 days.

(21) Appl. No.: 13/847,521

(22) Filed: Mar. 20, 2013

Related U.S. Application Data

(63) Continuation-in-part of application No. 13/168,603, filed on Jun. 24, 2011.

(51) Int. Cl.
*G05B 11/42* (2006.01)
*G06F 17/15* (2006.01)
(Continued)

(52) U.S. Cl.
CPC .................................... *G06F 17/15* (2013.01)

(58) Field of Classification Search
CPC ......... G05B 11/42; G06F 17/17; G06F 1/022; G06F 1/0321; G06F 3/05; G01C 7/04;
(Continued)

(56) References Cited

U.S. PATENT DOCUMENTS 4,244,336 A * 1/1981 Fitzner ................. F02P 5/1556
123/406.57
4,802,124 A * 1/1989 O'Brien, Jr. ........... G11C 14/00
365/185.07
(Continued)

FOREIGN PATENT DOCUMENTS

EP 2360448 8/2011

OTHER PUBLICATIONS

Yan et al. "Hilbert-Huang Transform-Based Vibration Signal Analysis for Machine Healthy Monitoring", IEEE Transactions on Instrumentation and Measurement, vol. 55, No. 6, Dec. 2006, pp. 2320-2329.*
(Continued)

*Primary Examiner* — Akash Saxena
*Assistant Examiner* — Shiuh-Huei Ku
(74) *Attorney, Agent, or Firm* — SPAWAR Systems Center Pacific; Kyle Eppele; J. Eric Anderson

(57) ABSTRACT

A method for approximating the behavior of a periodic parameter of a time-domain device in response to a perturbation, the method comprising the following steps: collecting data points at discreet times, wherein each data point represents a measurement of the parameter; dividing the time domain into intervals, each given interval containing at least one data point sampled during the given interval; fitting a polynomial function to the data points of each interval such that each interval has a corresponding polynomial function that is time-centered on the interval's center point and that accurately describes the parameter behavior over that interval; and stitching together the polynomial functions piecewise to create an analytic approximation of the behavior of the system parameter over the entire time domain.

18 Claims, 12 Drawing Sheets

(51) Int. Cl.

| | |
|---|---|
| G06F 17/17 | (2006.01) |
| G06F 3/05 | (2006.01) |
| H03K 17/955 | (2006.01) |
| G01P 15/125 | (2006.01) |
| G01P 15/135 | (2006.01) |
| G01C 19/5705 | (2012.01) |

(58) Field of Classification Search
CPC .... G01C 19/5705; H03K 17/955; H03B 5/30; G01P 15/097; G01P 15/125; G01P 15/135
USPC .................................................... 703/2, 6, 7
See application file for complete search history.

(56) References Cited

U.S. PATENT DOCUMENTS

| | | |
|---|---|---|
| 5,359,893 A | 11/1994 | Dunn |
| 5,646,346 A | 7/1997 | Okada |
| 7,591,201 B1 | 9/2009 | Bernstein |
| 2008/0143573 A1* | 6/2008 | Luthra ................. H04L 27/265 341/155 |
| 2009/0071247 A1 | 3/2009 | Konaka |
| 2009/0206953 A1 | 8/2009 | Pavlov |
| 2012/0065906 A1* | 3/2012 | Luce .................... G01R 31/316 702/57 |

OTHER PUBLICATIONS

Yan et al. "Hilbert Huang Transform-Based Vibration Signal Analysis for Machine Health Monitoring", IEEE Transactions on Instrumentation and Measurement, vol. 55, No. 6, Dec. 2006, pp. 2320-2329.*
Kim, C.-J.; Polynomial fit of interferograms; Applied Optics; vol. 21, No. 24; Dec. 15, 1982.
Sunter, Stephem K., & Nagi, Naveena; A Simplified Polynomial-Fitting Algorithm for DAC and ADC BIST, International Test Conference, IEEE; Jul. 1997.
European Patent Office Search Report, dated Mar. 18, 2016, PCT/US2013/025199.

* cited by examiner

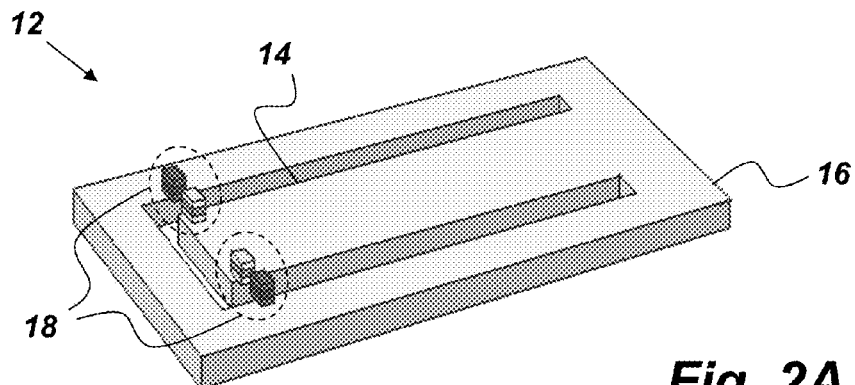
Fig. 2A
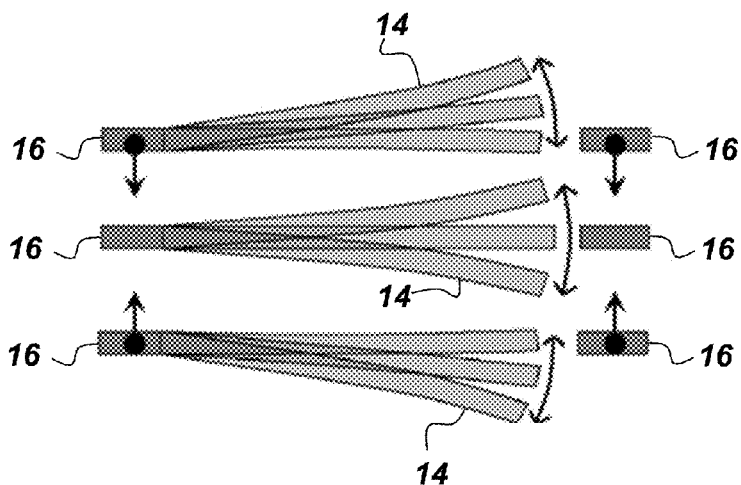
Fig. 2B
Fig. 2C
Fig. 2D

*1st Reference Position*

*2nd Reference Position*

*3rd Reference Position*

METHOD FOR ANALYTICAL RECONSTRUCTION OF DIGITAL SIGNALS VIA STITCHED POLYNOMIAL FITTING

CROSS-REFERENCE TO RELATED APPLICATION

This application is a continuation-in-part of U.S. application Ser. No. 13/168,603, filed 24 Jun. 2011, titled "Apparatus and Methods for Time Domain Measurement of Oscillation Perturbations" (Navy Case #100809), which application is hereby incorporated by reference herein in its entirety for its teachings, and referred to hereafter as "the parent application."

FEDERALLY-SPONSORED RESEARCH AND DEVELOPMENT

This invention is assigned to the United States Government and is available for licensing for commercial purposes. Licensing and technical inquiries may be directed to the Office of Research and Technical Applications, Space and Naval Warfare Systems Center, Pacific, Code 72120, San Diego, Calif., 92152; voice (619) 553-5118; ssc_pac_t2@navy.mil. Reference Navy Case Number 101592.

BACKGROUND OF THE INVENTION

This invention relates to the field of time-domain devices. One example of a time-domain device is an accelerometer wherein by measuring the times at which a harmonically oscillating proof mass passes predefined reference positions, the inertial acceleration can be determined. There exists a need for a better way to approximate the behavior of a periodic parameter of a time-domain device in response to a perturbation.

SUMMARY

Disclosed herein is a method for approximating the behavior of a periodic parameter of a time-domain device in response to a perturbation. The first step of the method provides for collecting data points at discreet times, wherein each data point represents a measurement of the parameter. The second step provides for dividing the time domain into intervals, each given interval containing at least one data point sampled during the given interval. The third step provides for fitting a polynomial function to the data points of each interval such that each interval has a corresponding polynomial function that is time-centered on the interval's center point and that accurately describes the parameter behavior over that interval. The fourth step provides for stitching together the polynomial functions piece-wise to create an analytic approximation of the behavior of the system parameter over the entire time domain.

Also disclosed herein is another embodiment of the method for approximating the behavior of a periodic parameter of a time-domain device in response to a perturbation. The first step in this embodiment of the method provides for measuring the parameter at discreet times, [$x_i$, $t_i$]. The second step in this embodiment provides for dividing the time domain into n time intervals of length $\Delta t$, each given interval containing at least k+1 discrete measurements of parameter x(t), wherein k and n are both positive integers greater than 1. The third step in this embodiment of the method provides for fitting a $k^{th}$ order polynomial function $P_n^k(t)$ to the measurements of each interval such that each interval has a corresponding polynomial function $P_n^k(t)$, thereby approximating parameter x(t) during each interval. The fourth step in this embodiment of the method provides for stitching together the polynomial functions piece-wise to create a smooth, analytic approximation of the behavior of the system parameter x(t) over the entire time domain.

Also disclosed herein is yet another embodiment of the method for approximating the behavior of a periodic parameter of a time-domain device in response to a perturbation. In this embodiment, the first step provides for collecting data points at discreet times while the device is at a known reference position and while subjected to the perturbation, wherein each data point represents a measurement of the parameter. The next step provides for forming a preliminary approximation of the behavior of the system parameter by calculating an offset bias of the time-domain device due to the perturbation. The next step provides for dividing the time domain into intervals, each given interval containing at least three data points sampled during the given interval. The next step provides for fitting a polynomial function to the data points of each interval such that each interval has a corresponding polynomial function. The next step provides for stitching together the polynomial functions piece-wise to create an analytic approximation of the behavior of the system parameter over the entire time domain. The next step provides for correcting the preliminary behavior approximation by comparing it to the analytic behavior approximation.

BRIEF DESCRIPTION OF THE DRAWINGS

Throughout the several views, like elements are referenced using like references. The elements in the figures are not drawn to scale and some dimensions are exaggerated for clarity.

FIG. 2A is a perspective view of an example embodiment of a time-domain inertial device. FIGS. 2B, 2C, and 2D are cross-sectional side views of a time-domain inertial device.

DETAILED DESCRIPTION OF EMBODIMENTS

Figure 1:
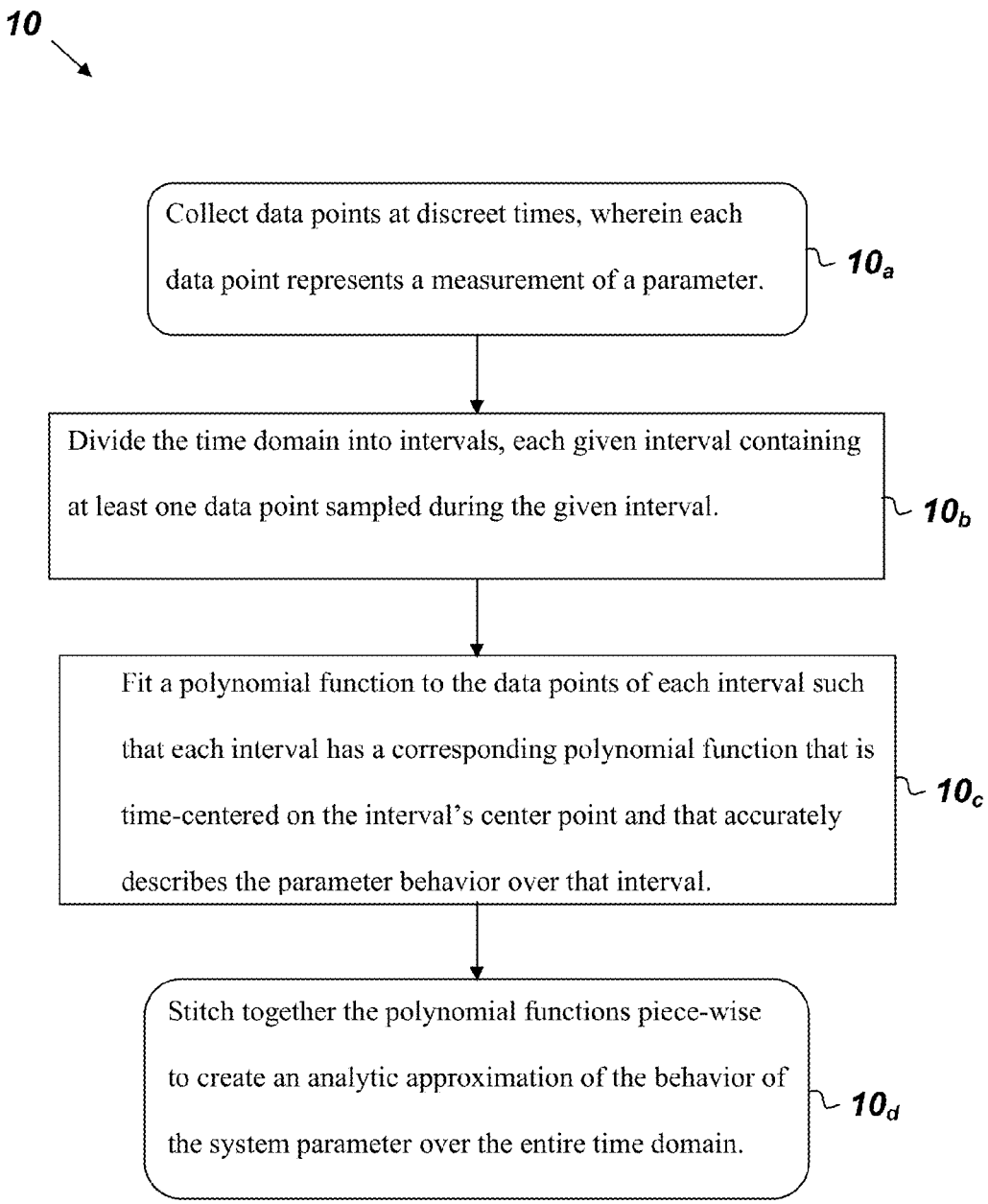
FIG. 1 is a flowchart of a method for approximating the behavior of a periodic parameter of a time-domain device in response to a perturbation.

FIG. 1 is a flowchart of a method 10 for approximating the behavior of a periodic parameter of a time-domain device in response to a perturbation. The stitched polynomial fitting method 10 generates a smooth, analytic approximation of the behavior of a given system parameter/variable using only a set of discrete measurements of that system parameter. The parameter behavior is approximated by a set of analytical functions, each valid only over a specific time range, which are then stitched together to form a complete picture of the parameter behavior in time. With this stitched polynomial function, an accurate digital reproduction of the parameter's behavior may be output (and subsequently processed) at any desired sampling rate, or at any specific time. The first step $10_a$ provides for collecting data points at discreet times. The data points may be collected either at specific instances or at some pickoff sampling rate. Each data point represents a measurement of the parameter. Step $10_b$ provides for dividing the time domain into intervals. Each given interval contains at least one data point sampled during the given interval. Step $10_c$ provides for fitting a polynomial function to the data points of each interval such that each interval has a corresponding polynomial function that is time-centered on the interval's center point and that accurately describes the parameter behavior over that interval. Step $10_d$ provides for stitching together the polynomial functions piece-wise to create an analytic approximation of the behavior of the system parameter over the entire time domain. Thus, the output data format has no correlation on the input data sampling rate/times-so long as the input data is sufficiently detailed to form a good polynomial fit to the parameter's behavior.

For example, if the behavior of a system parameter is desired to be output at 100 kHz but the system parameter is sampled at only 7 kHz, a polynomial fit can be generated using the 7 kHz samples, and that analytic polynomial function can then be used to generate an output of the data at 100 kHz as desired. Secondly, if samples are initially taken randomly in time, a polynomial fit can still be generated to fit those data points, and a reproduction can be generated at any fixed sampling rate or at any specific time instances. Lastly, if samples are initially taken at some fixed sampling rate, a polynomial fit can be generated to fit those data points, and a reproduction can be generated at any fixed sampling rate or at any specific time instances.

FIG. 2A is a perspective view of an example embodiment of a time-domain inertial device 12, which comprises a proof mass 14 in the form of a cantilever beam coupled to a rigid frame 16. The device 12 also comprises proximity switches 18 operatively coupled to both the rigid frame 16 and the proof mass 14. The proof mass 14 may be forced to oscillate sinusoidally. External accelerations to the device 12 perturb the oscillation-center linearly. FIGS. 2B, 2C, and 2D are cross-sectional side views of the device 12 illustrating movement of the proof mass 14 due to negative acceleration, zero acceleration and positive acceleration respectively of the rigid frame 16.

Figure 3A:
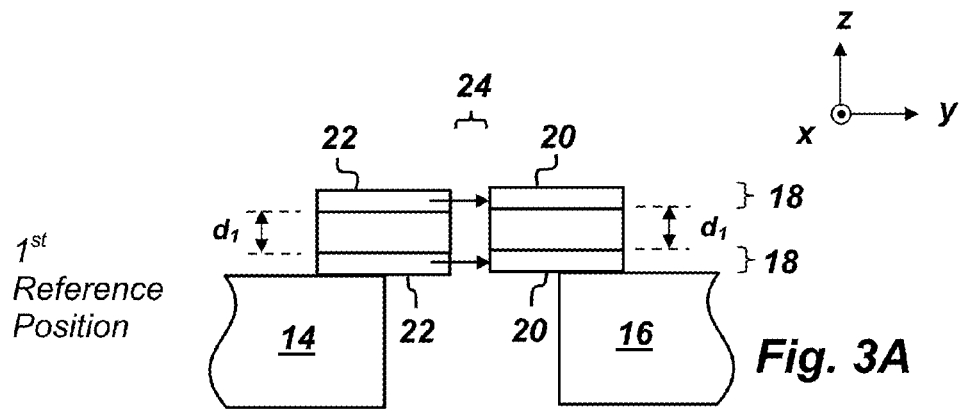
FIGS. 3A, 3B, and 3C are a series of cross-sectional front views of a pair of proximity switches in a time-domain inertial device.
Figure 3B:
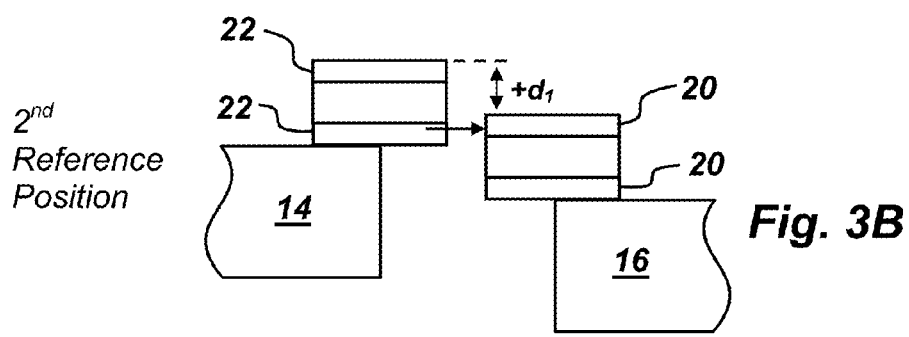
Figure 3C:
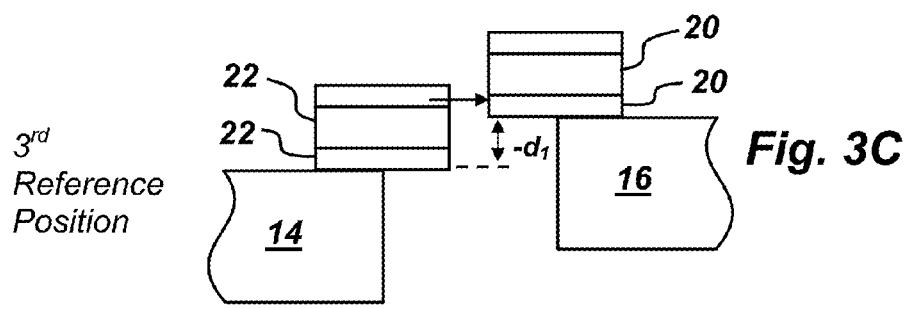

FIGS. 3A-3C illustrate an embodiment of a pair of proximity switches 18 such as is shown in FIG. 2A where the pair of switches 18 is configured to pass through multiple closed states corresponding to multiple reference positions of the proof mass 14 with respect to the rigid frame 16 during a single oscillation period. In this embodiment each proximity switch 18 comprises a first half 20 coupled to the frame 16 and a second half 22 coupled to the proof mass 14. When the proof mass 14 is in the first reference position, as shown in FIG. 3A, with respect to the rigid frame 16 the first and second halves 20 and 22 are aligned such that two closed states occur, as depicted by the arrows. The first halves 20 are aligned with each other in the z-direction and separated from each other in the z-direction by a distance $d_1$. Similarly, the second halves 22 are also aligned with each other in the z-direction and separated from each other in the z-direction by the distance $d_1$.

When the proof mass 14 is in the first reference position, or zero force position, such as is depicted in FIG. 3A, a current pulse passes from the each of the second halves 22 over a gap 24 to a corresponding first half 20. When the proof mass 14 is in a second reference position, as shown in FIG. 3B, the proof mass 14 is displaced from the first reference position in the z-direction by the distance+$d_1$. In the second reference position, a closed state occurs such that a current pulse may pass from the lower of the two second halves 22 to the upper of the two first halves 20. When the proof mass 14 is in a third reference position, as shown in FIG. 3C, the proof mass 14 is displaced in the z-direction by the distance $-d_1$. In the third reference position, a closed state occurs such that a current pulse passes from the upper of the two second halves 22 to the lower of the two first halves 20. The use of the term "current" above implies that the proximity switch employs a capacitive, quantum-tunneling, or other switch mechanism that generates an electrical current during its closed state. However, it is to be understood that the method 10 is not limited to use with current-generating proximity switches, but may be used with any type of proximity switch (e.g. micro-optical fibers and receivers) that experiences a closed state at a given reference position of the proof mass 14 with respect to the rigid frame 16.

Figure 4:
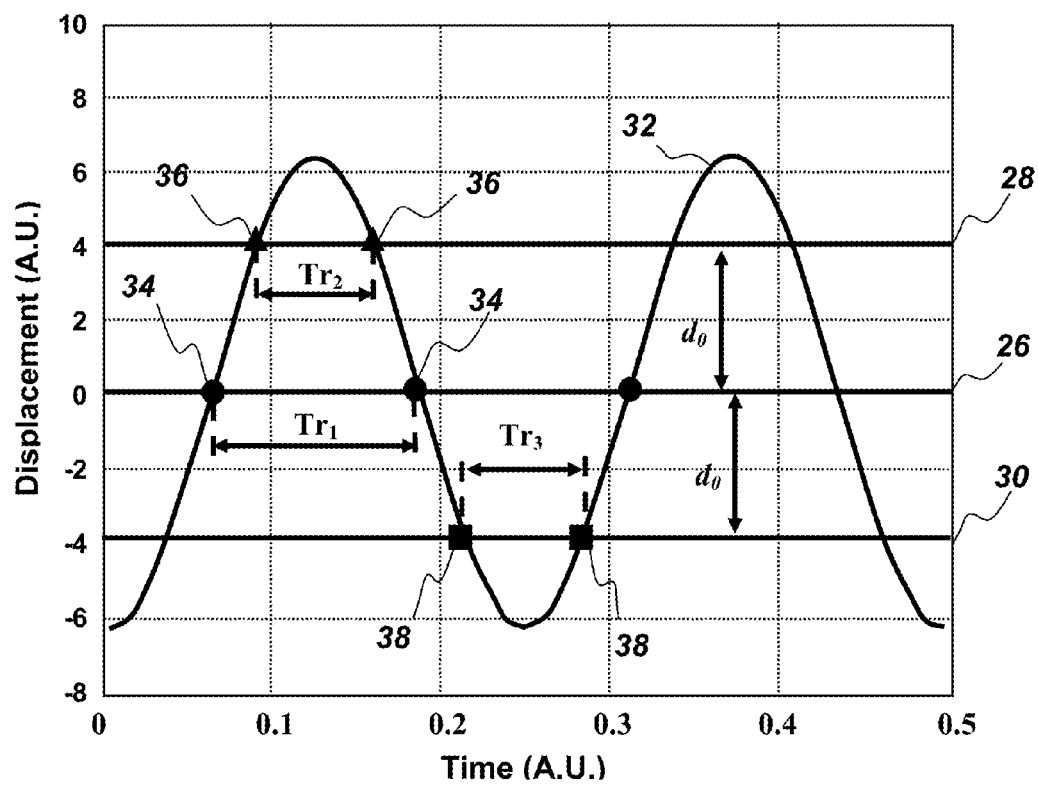
FIG. 4 is a plot of the displacement of a proof mass with respect to a rigid frame over time.

FIG. 4 is a plot of the displacement of the proof mass 14 with respect to the rigid frame 16 over time. The oscillatory motion of the proof mass 14 may be measured using "triggering" events that are generated when the mass passes through trigger points corresponding to predefined physical locations such as the first, second, and third reference positions depicted in FIGS. 3A-3C. The first reference position corresponds to a neutral (also referred to as a zero-force) point, represented by line 26 in FIG. 4. In the absence of any external forcing, the proof mass trajectory is centered at the first reference position. The second reference position corresponds to a positive trigger point, represented by line 28. The third reference position corresponds to a negative trigger point, represented by line 30. In the plot of FIG. 4, the trigger positions 28 and 30 are configured at the same predetermined distance $d_0$ (also referred to as the trigger gap or trigger spacing) away from the first reference position 26. As will be appreciated by those skilled in the art, other trigger configurations are compatible with the invention, such as, for example, asymmetric and/or multiple sets of positive and or negative trigger points 28, 30. In one specific variant, a single trigger position (such as the first reference position 26 for example) may be utilized.

In the plot of FIG. 4, the harmonic oscillations of the proof mass 14 (as shown for example by the un-forced trace 32) causes each of the triggering points 26, 28, and 30 to generate a pair of triggering events marked by the circles 34, triangles 36, and squares 38, respectively, for each full cycle of mass oscillation. In this embodiment, method 10 may be used to form a preliminary approximation of the behavior of the oscillating proof mass by calculating an offset bias of the time-domain device due to a perturbation. Time-intervals between triggering instances may be used to calculate inertial accelerations of the rigid frame 16. If one assumes the parameter behaves exactly as a cosine function with a fixed offset bias then the time periods between successive data points measured while the device is in the reference position may be compared to successive data points measured while the device is subjected to the perturbation to arrive at the preliminary behavior approximation. Timing of the triggering events 34, 36, 38 is measured using the same reference clock, and periods between successive crossings of the respective trigger points may be computed. That is, the period $Tr_1$ is determined by subtracting the times of the successive trigger events 34 (which correspond to the mass crossing of the reference trigger point 26). The period $Tr_2$ is determined by subtracting the times of the successive trigger events 36 (which correspond to the mass crossing of the positive trigger point 28). The period $Tr_3$ is determined by subtracting the times of the successive trigger events 38 (which correspond to the mass crossing of the reference point 30). In this method, the period of the resonant oscillation itself is determined by subtracting the First triggering time along 26 (left most circle) from the Third Triggering time along 26 (right most circle). The period of the oscillator, along with Tr1, and either Tr2 or Tr3, is required to calculate the offset of the oscillator due to the perturbation. In this method, the period of the resonant oscillation itself may be determined by subtracting the first triggering event 34 (left most circle) from the third triggering event 34 (right most circle). The period of the oscillator, along with Tr1, and either Tr2 or Tr3, is required to calculate the offset of the oscillator due to the perturbation.

The accuracy of the preliminary approximation referenced above is a function of the accuracy of the time intervals and the algorithm used to relate measured time intervals to inertial forces. Accordingly, the accuracy of such time-domain inertial devices is a function of the resolution of the clock used to measure triggering instances, the spatial accuracy/consistency of the triggering mechanism itself, and the quality of the algorithm used to correlate digital triggering instances into an inertial measurement. To record triggering instances in one embodiment of the inertial sensor, quantum tunneling devices with extremely precise spatial precision may be implemented as proximity switches. To measure the times at which triggering instances occur, time-to-digital converters with a 10 pico-second resolution may be implemented to detect tunneling current. However, it is to be understood that the method 10 is not limited to quantum tunneling inertial devices, but that they are merely provided as an example. Method 10 may be used with any time-domain device having a digital output. Method 10 may be applied to any system that has a periodic carrier plus some input offset modulation signal. Method 10 describes one way to take the switched output from such a system and provide an adequate curve fit to reconstruct the original signal. The original carrier signal can be mechanical, electrical, optical, etc in nature. The input can be any perturbation that causes an offset to the carrier. The type of perturbation is dependent on the type of carrier used.

However, the preliminary approximation is not the best fit for modeling the behavior of the inertial device due to time-varying perturbations. In the embodiment described above, method 10 uses the triggering data collected during a single mass-spring oscillation period to generate an analytic function which describes the mass' motion during that interval. Specifically, an optimized high-order polynomial function is employed. Using a series of such curve fits, one generated for every period of oscillation an analytic approximation to the signal for the entire time domain may be piece-wise constructed by linearly blending neighboring (and over-lapping) polynomial fits together.

Figure 5A:
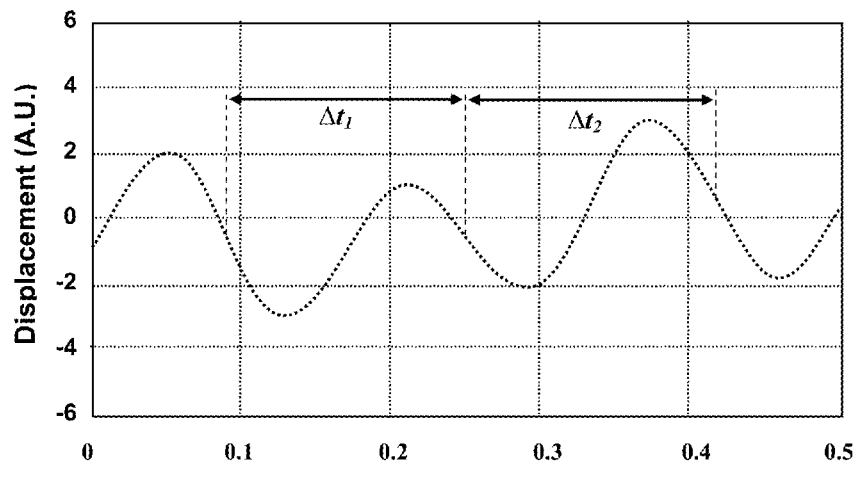
FIG. 5A is a plot of multiple measured values of a variable system parameter x(t) over time t.
Figure 5B:
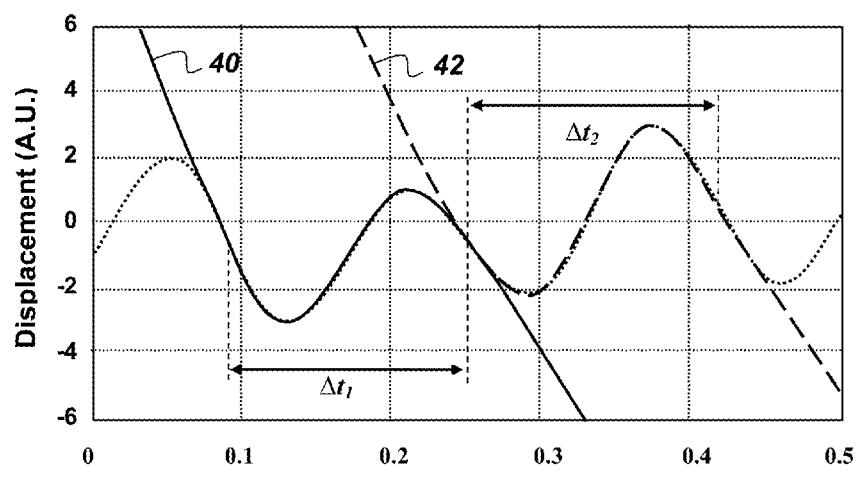
FIG. 5B is a plot showing analytic polynomial functions fit to discrete data points taken during their corresponding time intervals.

FIG. 5A is a plot of multiple measured values of a variable system parameter x(t) over time t. The variable system parameter x(t) is sampled at several discrete times, $[x_i, t_i]$. The time domain may be divided into intervals $\Delta t_n$, such as first and second time intervals $\Delta t_1$ and $\Delta t_2$, shown in FIG. 5A, where n is an integer greater than one. Each interval should contain at least one data point sampled during the given interval. FIG. 5B is an illustration of how for each time interval, an analytic polynomial function is fit to best represent the discrete data points taken during that interval. For example, FIG. 5B shows a first polynomial function, represented by the solid trace 40, which is fit to the data points within the first time interval $\Delta t_1$. A second polynomial function, represented by the dashed trace 42, which is fit to the data points within the second time interval $\Delta t_2$. Each successive short time interval has its own unique polynomial fit. The polynomial curves from adjacent time-intervals are then stitched together piece-wise to create an analytic approximation to x(t) for the entire time domain. It should be noted that method 10 is not restricted to time-dependant system variables, but could equivalently be applied to any measurable system variable with dependence on another measurable system parameter (e.g. y(z) instead of x(t)). Furthermore, the time-domain may be dissected into intervals of arbitrary length. Lastly, the pickoff sampling rate can vary freely in time. For simplicity of discussion herein, the time-dependant system variable x(t) will be measured at a constant sampling rate, and the time-domain will be split into intervals of equal length for the purposes of polynomial fitting. To approximate the system variable x(t) during each time interval $\Delta t_n$, we fit a $k^{th}$ order polynomial function $P_n^k(t)$ to the data points sampled during that time interval:

$$P_n^k(t) = (A_n^0) + (A_n^1)t + (A_n^2)t^2 + \ldots (A_n^k)t^k = \Sigma_{j=0}^k A_n^j t^j \qquad (1)$$

where $$t \in \left[-\frac{\Delta t}{2}, \frac{\Delta t}{2}\right],$$

k is an integer greater than one, A is a $k^{th}$ order polynomial coefficient, and j is a summation variable.

Polynomial functions are unbounded for large positive and negative values of t. Thus, each polynomial fit may be time-centered with respect to its interval, so to remain well behaved over the entire width of the interval. Once a polynomial fit is generated for a time interval, the variable behavior during that interval can be freely reproduced analytically. The full approximation for the system variable x(t) can then be built by piece-wise stitching together the polynomial approximations of x(t) for each interval. With reference to FIG. 5B, the stitching together can be visualized as combining the portion of the first polynomial 40 that fits within the first time interval $\Delta t_1$ with the portion of the second polynomial 42 that fits within the second time interval $\Delta t_2$. Mathematically, this is represented by summing the polynomial fits for each time interval, while appropriately time-shifting each polynomial fit to its interval's center point ($T_n$):

$$x(t) \approx \Sigma_{n=1}^{\infty} p_n^k (t+t_n) \quad (2)$$

where $T_n = (2n-1)/2\Delta t$.

As stated above, the method 10 generates an analytic approximation of the behavior of any measurable system parameter x(t) over the entire time domain. In the following discussion, the measured system parameter is the displacement of a proof mass as measured by triggering events of time-domain proximity switches. The ideal polynomial fit ($k^{th}$ order), to a set of n (n>k) triggered measurements of the mass' position ($x_i$, $t_i$) may be determined by solving the following set of linear equations:

$$\begin{bmatrix} x_1 \\ x_2 \\ \vdots \\ x_n \end{bmatrix} = \begin{bmatrix} 1 & t_1 & t_1^2 & \cdots & t_1^k \\ 1 & t_2 & t_1^2 & \cdots & t_2^k \\ 1 & \vdots & \vdots & \ddots & \vdots \\ 1 & t_n & t_n^2 & \cdots & t_n^k \end{bmatrix} \begin{bmatrix} P_0 \\ P_1 \\ \vdots \\ P_k \end{bmatrix} \rightarrow \vec{X} = \overleftrightarrow{T} \vec{P} \quad (3)$$

Specifically, by measuring the times ($t_i$) at which triggering events occur at predefined positions ($x_i$), the best fit polynomial coefficients ($A_k$) are be found by inverting equation (3):

$$\vec{P} = (\overleftrightarrow{T}{}^T \overleftrightarrow{T})^{-1} \overleftrightarrow{T}{}^T \vec{X} \quad (4)$$

Using equation (4), an analytical estimate of the mass' position is generated for the interval over which the triggering events occurred:

$$x(t) \approx P_k(t) = P_0 + P_1 * t\, P_2 * t^2 + \ldots + P_k * t^k = \Sigma_{j=0}^k P_j t^j \quad (5)$$

By dividing time into short intervals and repeating the process defined by equations (3) through (5), a unique polynomial fit is generated for each interval. The time intervals are kept sufficiently short, and the number of triggering points within each interval is kept sufficiently high, such that a polynomial fit very accurately describes the position of the mass. Neighboring polynomial fits can be linearly blended into one another to form a smooth, continuous approximation of the mass' position for large time spans.

Herein we discuss an example embodiment of a time-domain-triggered inertial device consisting of a spring-mass system with a 5.0 kHz resonant frequency. This mass is harmonically oscillated with a constant 500 nm amplitude (1 μm peak-to-peak) serving as the carrier signal. This motion ensures that seven predefined triggers, located at $x_i$=[0.0 nm, ±100 nm, ±200 nm, ±300 nm], are each excited twice during a full oscillation period (See FIG. 6A).

Figure 6A:
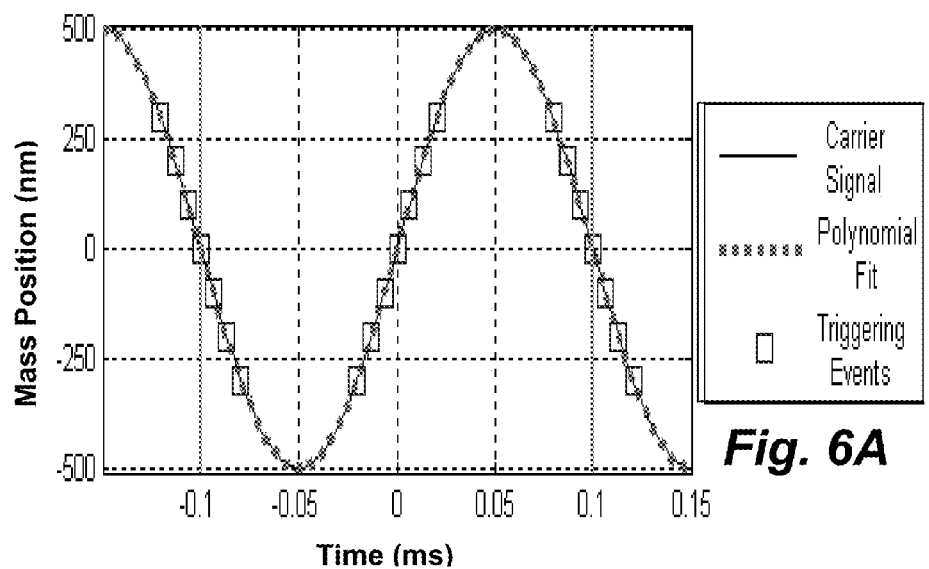
FIG. 6A is a plot of an optimized polynomial fit to a pure sinusoidal carrier signal.

FIG. 6A is a plot of an optimized polynomial fit to a pure sinusoidal carrier signal. In FIG. 6A the actual carrier signal (represented by the solid line) is shown overlaid with the polynomial fit (represented by the dotted line). The polynomial fit is generated from the triggering point data (represented by the squares), which are generated by seven symmetrically placed triggering mechanisms spanning 30% of the carrier signal's peak-to-peak amplitude. Thus, for any carrier oscillation zero-crossing, there are seven sequential triggering events—each temporally measured by a device with a 10 pico-second ($10^{-11}$ s) resolution. In this configuration, over the course of three consecutive zero-crossings (approximately over one period of carrier signal oscillation), data from twenty-one triggering events may be used to solve equations (3)-(5). This process generates a polynomial fit which well approximates the mass' position during that oscillation period.

Figure 6B:
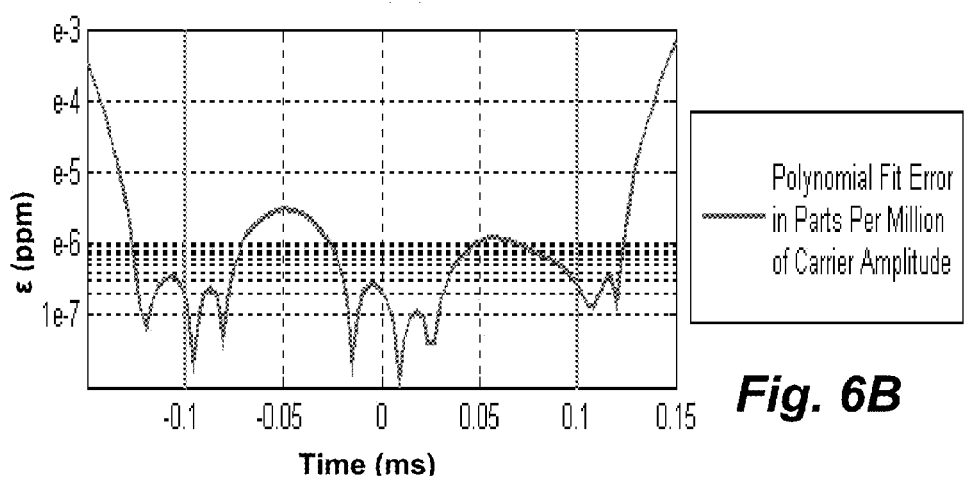
FIG. 6B is a plot of the absolute value of the polynomial fit's error plotted in parts-per-million of the carrier amplitude.

FIG. 6B is a plot of the absolute value of the polynomial fit's error plotted in parts-per-million of the carrier amplitude. As can be seen, the polynomial fit diverges to large errors outside the area of interest (one oscillation period—bounded by solid vertical lines), but has a mean value of 0.851 ppm within. A $13^{th}$ order polynomial (k=13) may be suitable for minimizing error. As can be seen in FIG. 6B, an average error of 0.851 parts-per-million is achieved over the range of interest. This process is repeated for each successive triplet of zero-crossings (approximately once every half-period of carrier signal oscillation). Lastly, neighboring and overlapping polynomial fits are linearly blended to continuously estimate the mass' position for all time.

In a real world environment, this carrier sinusoid is modulated by time-varying displacements due to inertial accelerations. These displacements must also be captured accurately by the polynomial approximation. Specifically, for a linear spring system obeying Hooke's law, inertial accelerations ($a_I$) cause mass displacements ($x_m$) according to:

$$F_g = m * a_I = k * x_m \rightarrow x_m = \frac{g}{(2\pi f_0)^2} \approx 9.93 \text{ nm} \quad (6)$$

Where g=9.8 m/s² is the acceleration due to gravity, and $f_0$=5.0 kHz is the resonant frequency such that $k = m(2\pi f_0)^2$. Thus, an acceleration of one g (9.8 m/s²) will result in a 9.93 nanometer displacement of the spring-mass system. For a 5.0 kHz, ±500 nm carrier oscillation with maximum triggering points located at ±300 nm, a peak inertial displacement of ±200 nm is permitted—corresponding to a full scale range of ±20.142 g of acceleration. Herein, the physical mass displacement is often converted into an equivalent inertial acceleration (in units of g) for intuitive clarity. In order to accommodate larger inertial accelerations, the mass-spring system may be made stiffer; alternatively, the triggering locations may be placed closer to zero (e.g. $|x_{max}|$<300 nm) or the amplitude of carrier oscillations can be increased beyond ±500 nm—thus increasing the range of allowed inertial displacements. Similar, but opposite, adjustments can be made to reduce the range of allowed inertial acceleration inputs if, for example, high resolution measurements of slight inertial accelerations are desired.

Figure 7A:
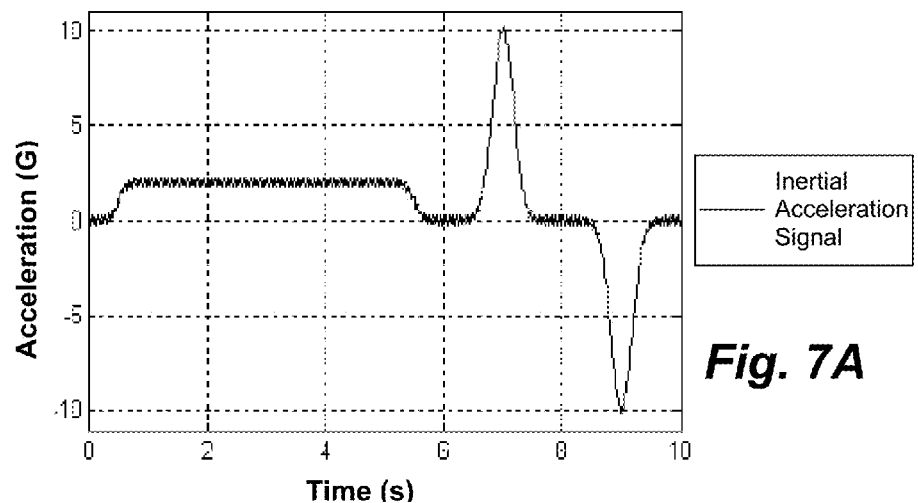
FIG. 7A is a plot showing an example of time-varying inertial acceleration that an inertial device is intended to measure.

FIG. 7A is a plot showing an example of time-varying inertial acceleration that the inertial device is intended to measure. The inertial signal contains: an initial period of stable 2 g acceleration from roughly 0.5 to 5.5 seconds, followed by large positive and negative 10 g pulses at 7 and 9 seconds. A small 0.2 g vibration at 15 Hz exists throughout.

Figure 7B:
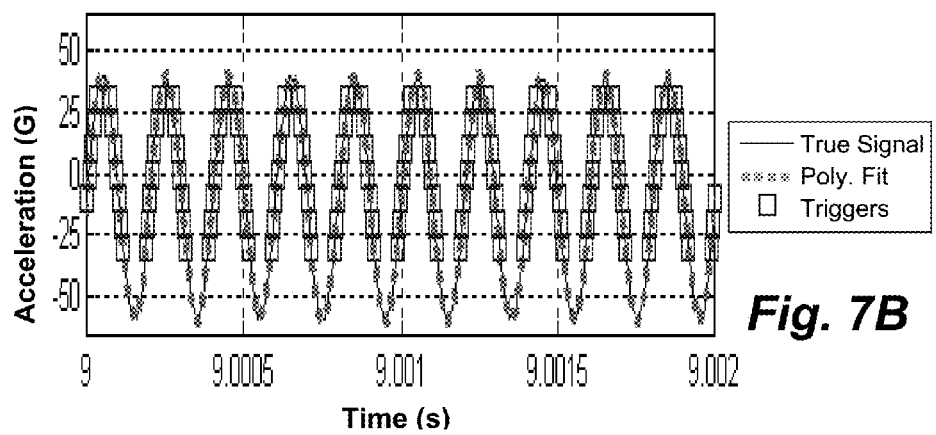
FIG. 7B is a plot showing the optimized polynomial fit to the overall signal.

FIG. 7B is a plot showing the optimized polynomial fit to the overall signal—which is the sum of the inertial signal shown in FIG. 7A and the ±500 nm, 5.0 kHz carrier signal. In FIG. 7B the true acceleration signal, converted to units of g, is shown, with the polynomial fit (sampled at 51.394 kHz) overlaid. The polynomial fit may be out-sampled at an arbitrary high frequency of 51.349 kHz to well resolve the 5.0 kHz carrier.

Figure 8A:
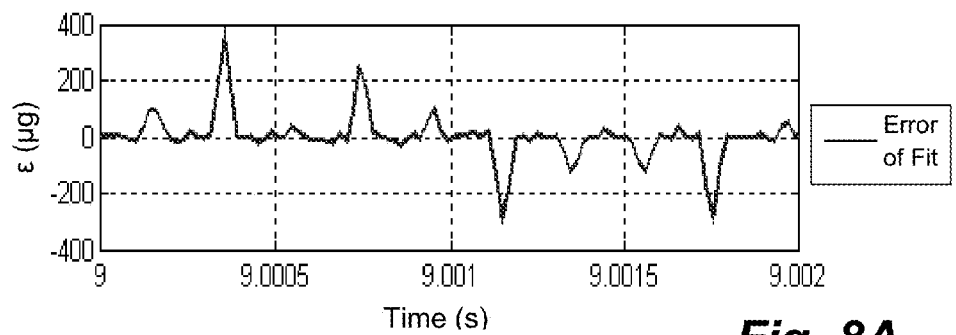
FIG. 8A is a plot showing the zero-centered error of a polynomial fit.

FIG. 8A is a plot showing the zero-centered error of the fit—defined as the difference between the polynomial fit and the actual signal at each point in units of μg (1 μg=9.8E⁻⁶ m/s²). As seen in the error plot of FIG. 8A, despite the added complexity of the inertial content modulating the carrier, the polynomial fit maintains a low average error magnitude of 26.90 µg. The peak error magnitude occurs at the extreme values of the function where the polynomial fit is furthest from tunneling data points (max: 282.6 µg). The error is centered about zero because the polynomial nature of the fit tends to wander equally both above and below the true signal value. This unique feature results in an extremely valuable result: a low error average (e.g. the average of all error values in time) of roughly ±0.18 µg.

Figure 8B:
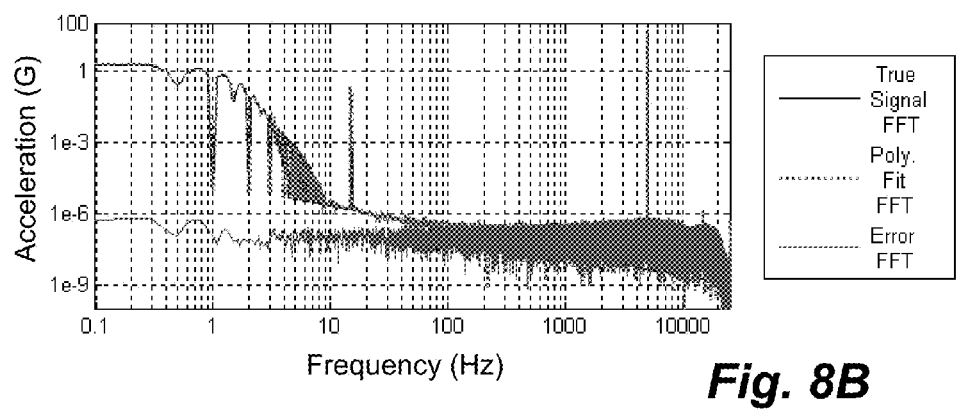
FIG. 8B is a plot showing the Fast Fourier Transforms of a true signal, polynomial fit, and error respectively.

FIG. 8B is a plot showing the Fast Fourier Transforms of the true signal, polynomial fit, and error respectively. The 5.0 kHz carrier component can clearly be identified, as can the low frequency inertial content (including a 15 Hz sinusoid). Fast Fourier Transforms (FFTs) show good frequency content agreement between the actual signal and the polynomial fit. The FFT of the error is several orders of magnitude suppressed in the low frequency realm of the inertial accelerations of interest. As can be seen in FIG. 8A, the error content of the polynomial fit is zero centered and provides a white noise floor below 1 µg, as shown in FIG. 8B.

Error can be reduced through intelligent output sampling. The final outcome of method 10 is not the generation of an accurate fit to the combined carrier/inertial signal (such as is shown in FIG. 7B), but rather method 10 may be used to accurately retrieve the inertial portion of the signal alone (such as is shown in FIG. 7A). If the resonant carrier frequency of the spring-mass system is accurately known, the inertial portion of the signal can be effectively isolated from the carrier signal. This is done by exploiting the analytic nature of the polynomial fit (e.g. the ability to reproduce the mass position at any desired time or sampling rate). Specifically, this may be achieved by intelligently output sampling the polynomial fit at a multiple of the frequency of the carrier sinusoid.

Figure 9A:
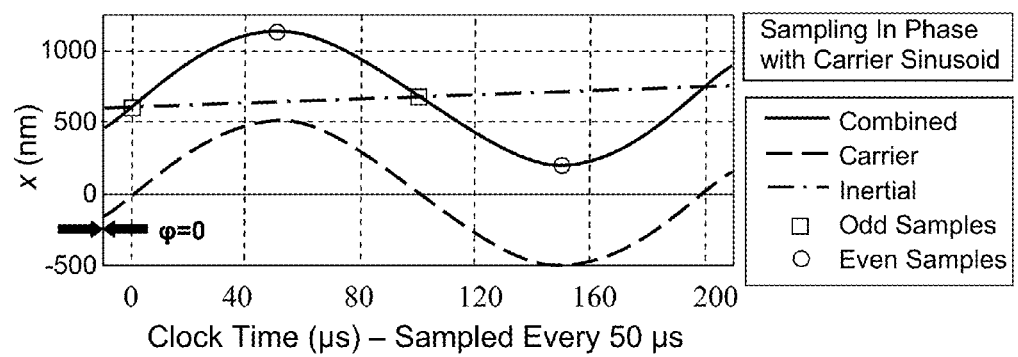
FIGS. 9A and 9B are plots depicting an inertial signal, a carrier signal, and a combined signal (inertial plus carrier) output sampled at four times the carrier frequency.
Figure 9B:
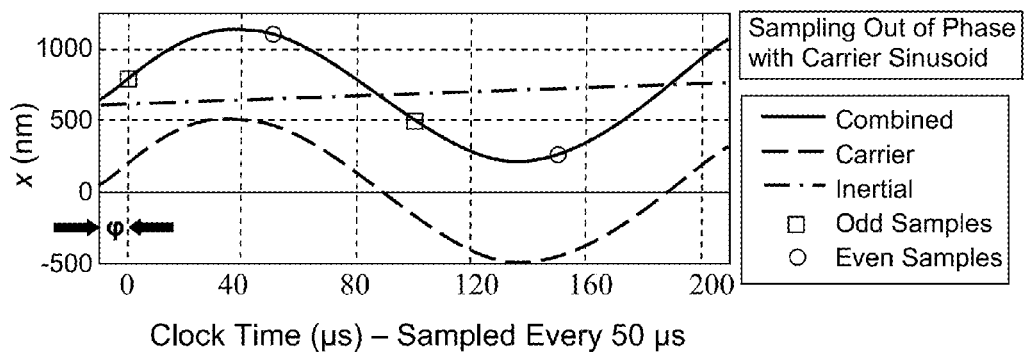

FIGS. 9A and 9B, for example, are plots depicting the inertial signal, the carrier signal, and the combined signal (inertial plus carrier) output sampled at four times the carrier frequency (20 kHz). FIG. 9A depicts output sampling that is in-phase with respect to the carrier sinusoid ($\phi$=0), while FIG. 9B shows output sampling that is out of phase ($\phi \neq 0$). Assuming an arbitrary, but constant, phase ($\phi$) exists between the polynomial fit output sampling and the carrier sinusoid, the polynomial fit can be written:

$$a_P(t) = a_I(t) + A_C \sin(2\pi f_0 t + \phi) \quad (7)$$

where $a_I(t)$ is the inertial acceleration and $A_C$ is the amplitude of the carrier sinusoid converted to units of acceleration via equation 6. Intelligently output sampling (i.e., equation 7) at four times the carrier frequency (20 kHz at $t_n = n/[4f_C]$, where n=0, 1, 2 . . . ) exploits the quarter-wave symmetry of the carrier sinusoid. If the change in amplitude of the carrier signal is negligible over four successive output samples, then during any single oscillation period the output samples can be written as:

$$a_0 = a_I(t_0) + A_C \sin(\phi), \quad (8a)$$

$$a_1 = a_I(t_1) + A_C \cos(\phi), \quad (8b)$$

$$a_2 = a_I(t_2) - A_C \sin(\phi), \quad (8c)$$

$$a_3 = a_I(t_3) - A_C \cos(\phi). \quad (8d)$$

If the phase of the carrier signal can be determined, the output sampling is aligned to the carrier signal—effectively setting $\phi$=0, $\sin(\phi)$=0, and $\cos(\phi)$=1 (See FIG. 9A). In this case, equations 8a and 8c directly estimate the inertial component in real time. For an unknown, constant phase between the output sampling and the carrier (e.g., FIG. 9B), the inertial signal is estimated by averaging equations 8a,c and 8b,d respectively:

$$a_I(t_1) \approx \frac{a_0 + a_2}{2} = \frac{a_I(t_0) + a_I(t_2)}{2}, \quad (9a)$$

$$a_I(t_2) \approx \frac{a_1 + a_3}{2} = \frac{a_I(t_1) + a_I(t_3)}{2}, \quad (9b)$$

This method results in a one sample output delay, as is evidenced in equations 9a-9b by the fact that the inertial force at $t_i$ is calculated using a sample recorded at $t_i$+1. Furthermore, if the change in inertial acceleration over four consecutive out-samples is negligible (e.g. during periods of constant inertial velocity), the phase and amplitude of the carrier can be accurately determined using equation 8 via:

$$\varphi = \arctan\left(\frac{x_0 - x_2}{x_1 - x_3}\right), \quad (10a)$$

$$A_C = \frac{x_0 - x_2}{2\sin(\varphi)} = \frac{x_1 - x_3}{2\cos(\varphi)} \quad (10b)$$

where equation 10a is solved for and then substituted into equation 10b. If only the inertial acceleration measurement is desired, then sampling at two times the carrier frequency is sufficient. Specifically, by setting $\phi$=0 and then using equations 8a and 8c or, if the phase is unknown, using 9a and 9b. By output sampling in phase with the carrier at twice the carrier frequency, the polynomial fit automatically estimates the inertial signal alone. In other words, by output sampling at two times the carrier frequency (in phase with the carrier sinusoid), the inertial portion of the signal is isolated.

Intelligent sampling at twice the carrier frequency reduces all error values with respect to standard sampling. Compared to the error of fit when sampling at 51.394 kHz (such as is shown in FIG. 8A), using intelligent sampling reduces the peak error magnitude from 282.34 µg to 41.01 µg. The average error magnitude is also reduced from 26.9 µg to 7.26 µg and the error sum is reduced from ~±0.18 µg to ~±0.03 µg. This error magnitude reduction is a feature of the fact that the polynomial fit tends to be higher quality (lower error) near the triggering instances (e.g. between x=±300 nm). Intelligent sampling tends to regenerate the polynomial fit only within this range, since the sensor is designed to not allow inertial accelerations to displace the mass outside of this range.

Intelligent sampling at twice the carrier frequency results in a measurement error which toggles between positive and negative values. The feature may be exploited by simply averaging successive pairs of data. Doing so results in an overall reduction in the peak and mean error magnitudes. Performing a large number of running two-point averages significantly reduces the average error magnitude, but at the cost of an increased output delay. This delay is equal to the number of averaging iterations performed multiplied by one half the sample time.

Figure 10:
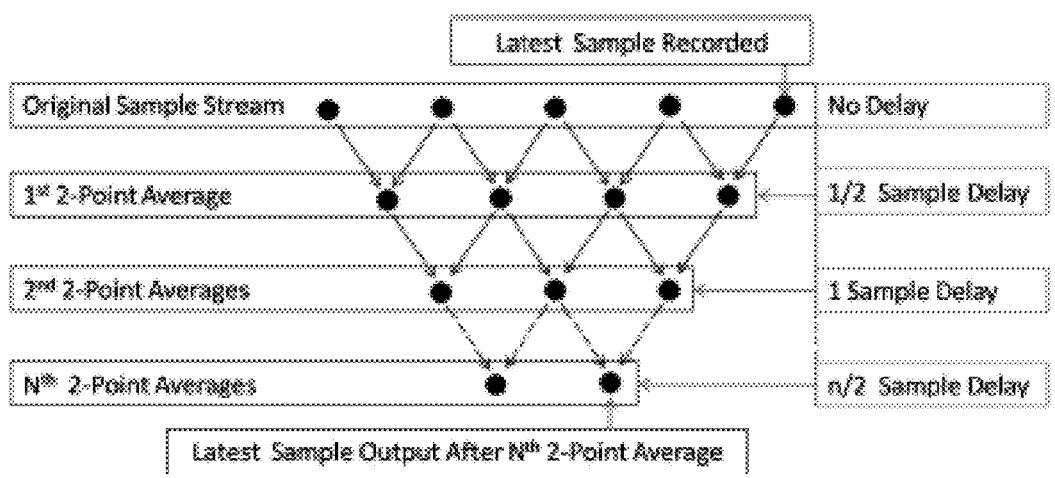
FIG. 10 is an illustration showing an iterative two-point averaging process and resultant output delays.

FIG. 10 is an illustration showing an iterative two-point averaging process and resultant output delays. Taking successive two-point averages of a sample stream results in a net delay of the output signal equal to n/2 samples—where n is the number of iterations. Additionally, the final data stream is truncated by n points—n/2 points on either side of the original sample stream. The largest single reduction in mean error magnitude occurs in the first two-point average—where it is reduced from 7.26 µg to 5.12 µg. However, by performing one hundred averaging cycles, the mean error magnitude has been reduced to 1.71 µg. For applications where accurate measurements are required immediately (e.g. navigation), taking a large number of two-point averages is impractical due to the resultant delay of the output data stream. However, for applications where a low overall noise floor is critical, the algorithm-induced noise can be greatly reduced by employing successive two-point averaging iterations.

To determine a navigational position from a known initial location, the inertial acceleration data is integrated twice in time. Thus, the fact that intelligently sampled polynomial fits generate error values which toggle between positive and negative values—resulting in a very low error sums—is invaluable. In reality, it is not the error sum that is the critical parameter, but rather the second time integral of the error in inertial acceleration measurement. To determine the time integrated error, the true inertial acceleration and the intelligently output sampled polynomial fit are each integrated twice and compared.

Figure 11A:
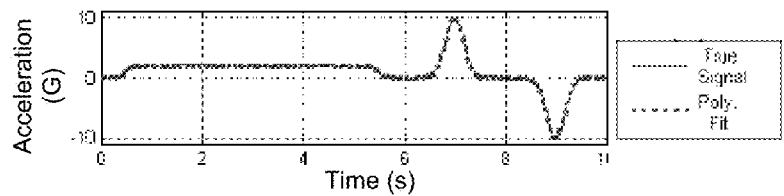
FIGS. 11A-11F are plots illustrating a navigational operational embodiment for a method for approximating the behavior of a periodic parameter of a time-domain device in response to a perturbation.
Figure 11B:
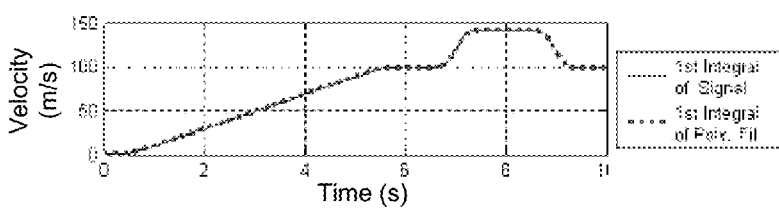
Figure 11C:
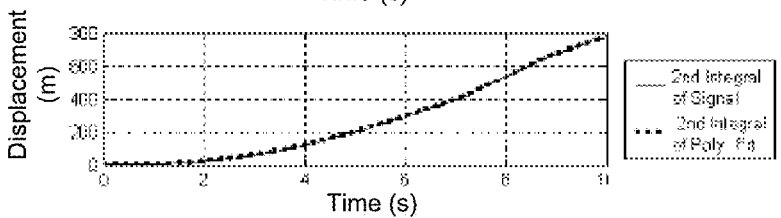
Figure 11D:
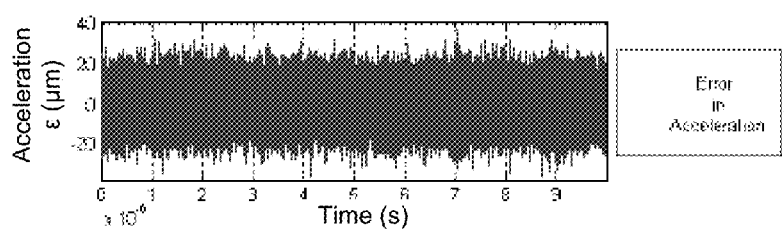
Figure 11E:
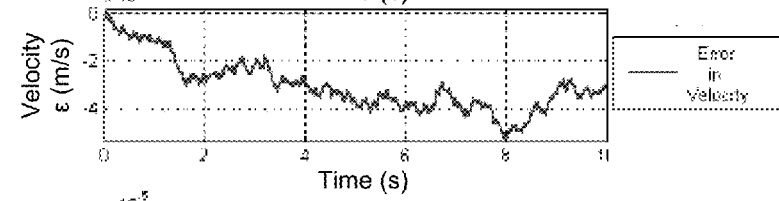
Figure 11F:
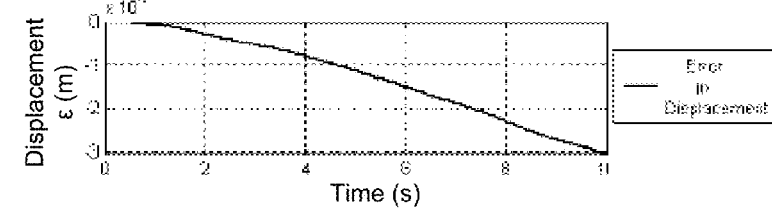

FIGS. 11A-11F are plots illustrating the application of method 10 to inertial acceleration measurements taken in a navigational operational embodiment. FIG. 11A shows the true inertial acceleration as well as the polynomial fit estimate overlaid. FIGS. 11B and 11C show the true/estimated velocity and displacement functions (e.g. 1st and 2nd time integrals of the inertial acceleration data). FIGS. 11D, 11E, and 11F depict the error of the polynomial fit for the acceleration, velocity, and displacement measurements respectively. As can be seen, over a 10 second period, a total net displacement of 773.04426523 m is achieved, while the error in the estimate of this value via the polynomial fit method is only −30.52 µm.

Figure 12:
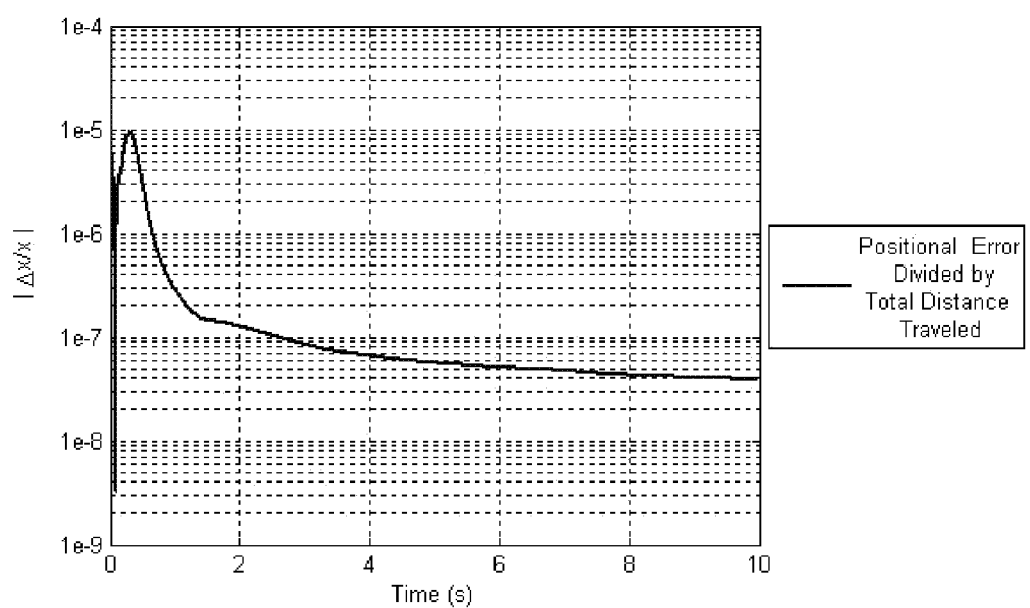
FIG. 12 is a plot of a relative navigational position error as a function of time.

FIG. 12 is a plot of the relative navigational position error as a function of time. To show how the magnitude of the position error changes in time—with respect to the magnitude of the total distance traveled—FIG. 12 plots the absolute value of the ratio of these two numbers in time. After an initial period of growth, this value stabilizes and reduces to: $|\Delta x/x|$=3.94E-8. This implies that for every kilometer of distance traveled, the absolute error in the estimate of the location will be only 39.4 microns. Furthermore, the value of this parameter is not increasing in time, but appears at the end of the simulation to be decreasing in time—implying that the percent error in measurement (relative to the measurement itself) only improves with time.

The blended polynomial fit tends to slightly under-estimate the true magnitude of inertial accelerations (e.g. negative error). This systemic error can be seen in the first and second time integrals for velocity and displacement shown in FIGS. 11E and 11F. Thus the error for large positive accelerations will result in a negative position measurement error. Conversely, the error for negative accelerations will result in a positive position measurement error. In FIGS. 11A-11F, the net position error is negative because the inertial acceleration signal used (See FIG. 7A) is more often positive than it is negative. However, for real life inertial accelerations with roughly equal components in both directions, the underestimates in the inertial error measurement associated with the polynomial fit method would tend to cancel each other resulting in further reduction of the displacement error.

From the above description of the method 10, it is manifest that various techniques may be used for implementing the concepts of method 10 without departing from its scope. The described embodiments are to be considered in all respects as illustrative and not restrictive. It should also be understood that method 10 is not limited to the particular embodiments described herein, but is capable of many embodiments without departing from the scope of the claims.

We claim:

1. A method for approximating the behavior of a periodic parameter of a time-domain proximity switch accelerometer in response to a perturbation, the method comprising the following steps:
   generating a triggering event when a first element of a switch within the time-domain proximity switch accelerometer passes a second element of the switch, wherein the first element is in oscillation and the second element is located at a fixed trigger position of one or more fixed trigger positions within the amplitude range of the oscillation, wherein the fixed trigger positions are predefined physical locations with respect to a reference position of the first element;
   determining at least one time period between successive triggering events;
   using the at least one time period and the fixed trigger position of the second element to determine the periodic parameter;
   collecting data points at discrete times, wherein each data point represents a measurement of the parameter;
   forming a preliminary approximation of the behavior of the system parameter by calculating an offset bias of the time-domain proximity switch accelerometer due to the perturbation;
   dividing the time domain into intervals, each given interval containing at least one data point sampled during the given interval;
   fitting a polynomial function to the data points of each interval such that each interval has a corresponding polynomial function that is time-centered on the interval's center point and that accurately describes the parameter behavior over that interval;
   stitching together the polynomial functions piece-wise to create an analytic approximation of the behavior of the periodic parameter over the entire time domain; and
   altering a navigational course of a moving vehicle based on the preliminary approximation and correcting the altered navigational course based on the analytic approximation.

2. The method of claim 1, wherein the stitching step is performed by summing the polynomial functions of each interval.

3. The method of claim 2, wherein the parameter is a time-dependent system variable x(t) of the time-domain proximity switch accelerometer.

4. The method of claim 2, wherein the parameter is a measurable system variable y(z) which depends on a measurable system variable other than time.

5. The method of claim 1, wherein the parameter is a closed switch state.

6. The method of claim 2, wherein the intervals are not uniform but are of arbitrary length.

7. The method of claim 2, wherein the intervals are of equal length.

8. The method of claim 2, wherein the data points are collected at a non-constant sampling rate.

9. The method of claim 2, wherein the data points are collected at a constant sampling rate.

10. The method of claim 2, wherein the perturbation is a physical acceleration of the time-domain proximity switch accelerometer.

11. A method for approximating the behavior of a system parameter x(t) of a time-domain proximity switch accelerometer in response to a perturbation, the method comprising the following steps:
generating a triggering event when a first element of a switch within the time-domain proximity switch accelerometer passes a second element of the switch, wherein the first element is in oscillation and the second element is located at a fixed trigger position of one or more fixed trigger positions within the amplitude range of the oscillation, wherein the fixed trigger positions are predefined physical locations with respect to a reference position of the first element;
determining at least one time period between successive triggering events;
measuring the parameter at discrete times, $[x_i, t_i]$;
forming a preliminary approximation of the behavior of the system parameter by calculating an offset bias of the time-domain proximity switch accelerometer due to the perturbation;
dividing the time domain into n time intervals of length $\Delta t$, each given interval containing at least k+1 discrete measurements of parameter x(t), wherein k and n are both positive integers greater than 1;
fitting a $k^{th}$ order polynomial function $P_n^k(t)$ to the measurements of each interval such that each interval has a corresponding polynomial function $P_n^k(t)$, thereby approximating parameter x(t) during each interval;
stitching together the polynomial functions piece-wise to create a smooth, analytic approximation of the behavior of the system parameter x(t) over the entire time domain; and
altering a navigational course of a moving vehicle based on the preliminary approximation and correcting the altered navigational course based on the analytic approximation.

12. The method of claim 11, wherein the polynomial function $P_n^k(t)$ is defined as follows:

$$P_n^k(t) = (A_n^0) + (A_n^1)t + (A_n^2)t^2 + \ldots (A_n^k)t^k = \sum_{j=0}^{k} A_n^j t^j$$

where $$t \in \left[-\frac{\Delta t}{2}, \frac{\Delta t}{2}\right],$$

and where A is a $k^{th}$ order polynomial coefficient, and j is a summation variable.

13. The method of claim 12, wherein stitching step is accomplished by time shifting each polynomial fit to its corresponding interval's center point ($T_n$) and summing the time-centered polynomials as follows:

$$x(t) \approx \sum_{n=1}^{\infty} P_n^k(t + T_n)$$

where $T_n = (2n-1)/2\Delta t$.

14. A method for approximating the behavior of a system parameter of a time-domain proximity switch accelerometer in response to a perturbation, the method comprising the following steps:
generating a triggering event when a first element of a switch within the time-domain proximity switch accelerometer passes a second element of the switch, wherein the first element is in oscillation and the second element is located at a fixed trigger position of one or more fixed trigger positions within the amplitude range of the oscillation, wherein the fixed trigger positions are predefined physical locations with respect to a reference position of the first element;
determining at least one time period between successive triggering events;
collecting data points at discrete times while the first element is at a known reference position and while the device is subjected to the perturbation, wherein each data point represents a measurement of the parameter;
forming a preliminary approximation of the behavior of the system parameter by calculating an offset bias of the time-domain proximity switch accelerometer due to the perturbation;
dividing the time domain into intervals, each given interval containing at least three data points sampled during the given interval;
fitting a polynomial function to the data points of each interval such that each interval has a corresponding polynomial function;
stitching together the polynomial functions piece-wise to create an analytic approximation of the behavior of the system parameter over the entire time domain;
correcting the preliminary behavior approximation by comparing it to the analytic behavior approximation; and
altering a navigational course of a moving vehicle based on the preliminary approximation and correcting the altered navigational course based on the analytic approximation.

15. The method of claim 14, wherein the step of calculating the offset bias is accomplished by assuming the parameter behaves exactly as a cosine function with a fixed offset and by comparing time periods between successive data points measured while the device is in the reference position to successive data points measured while the device is subjected to the perturbation.

16. The method of claim 1, wherein the first element and the second element comprise electron tunneling electrodes and the triggering event is a tunneling current between the first element and the second element.

17. The method of claim 1, wherein the step of using the at least one time period to determine the periodic parameters comprises using a time period between successive triggering events with respect to the same fixed trigger position.

18. The method of claim 1, wherein the first element is disposed on a proof mass assembly and the second element is disposed on a frame fixed in location with respect to the proof mass assembly.

* * * * *